Feb. 10, 1970 R. L. JAMES 3,495,073
BINARY COUNTER
Filed Dec. 21, 1966
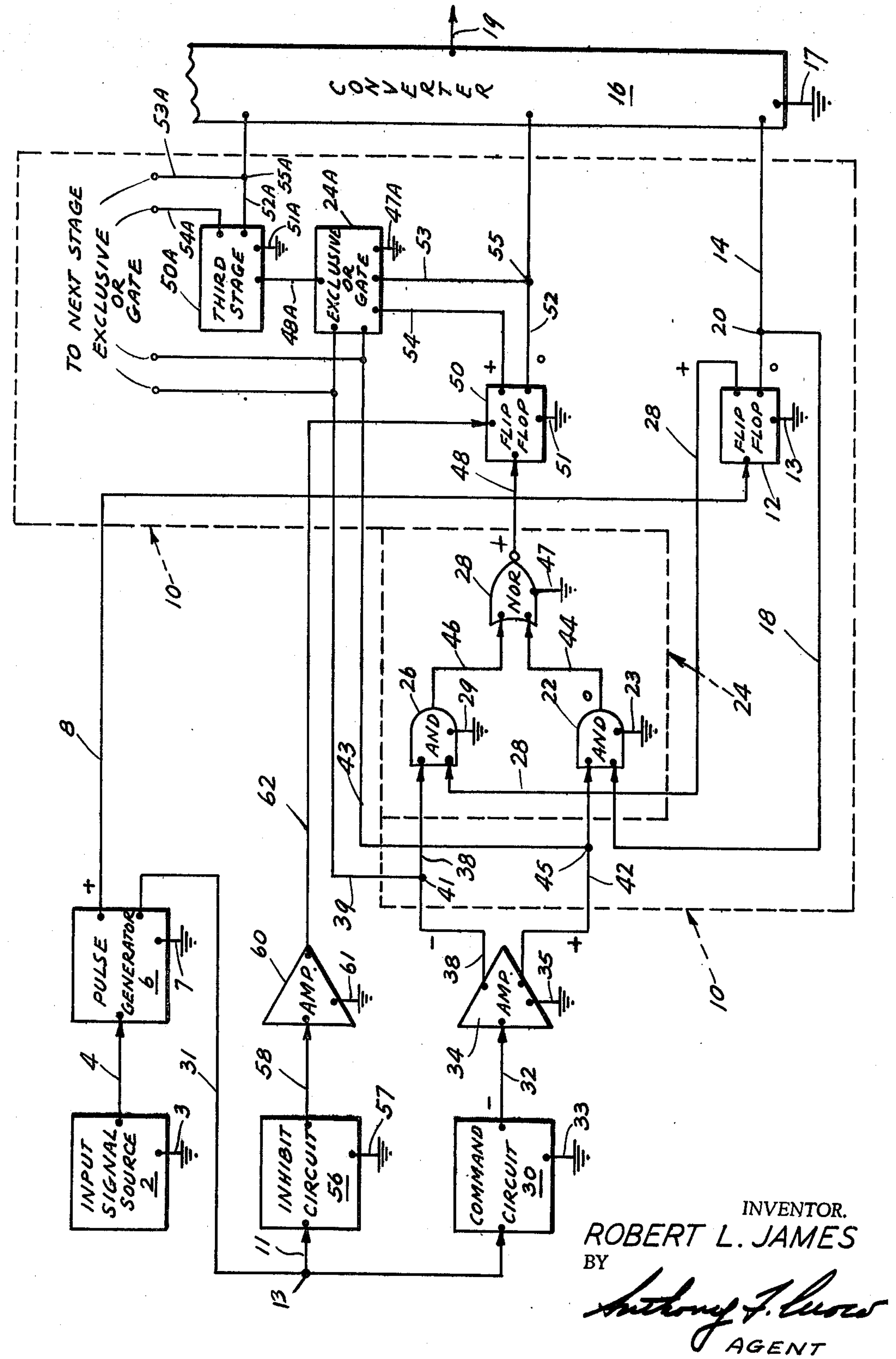
INVENTOR.
ROBERT L. JAMES
BY
Anthony J. Lucas
AGENT United States Patent Office 3,495,073
Patented Feb. 10, 1970

3,495,073

BINARY COUNTER

Robert L. James, Bloomfield, N.J., assignor to The Bendix Corporation, a corporation of Delaware Filed Dec. 21, 1966, Ser. No. 603,631
Int. Cl. G06f 7/38; G06g 7/00; H04l 3/00
U.S. Cl. 235—92 12 Claims

ABSTRACT OF THE DISCLOSURE

A binary counter for counting the total number of pulses provided by a pulse generator, which pulses are provided at a frequency corresponding to the amplitude of an input signal, and including a plurality of stages each of which provides an output corresponding to a binary bit of the total number of pulses. The counter counts up and counts down in accordance with the polarity of the input signal and is inhibited from counting when the counting direction is changing.

Cross reference to related applications

The binary counter of the present invention is of the type which may be included in the digital system disclosed and claimed in copending U.S. application Ser. No. 558,-327, filed June 17, 1966. Control networks for the counter are disclosed and claimed in copending U.S. applications Ser. No. 570,643, filed Aug. 5, 1966, and Ser. No. 592,045, filed Nov. 4, 1966. The counter is driven by pulses provided by a pulse generator which includes a voltage to frequency converter of the type described in copending U.S. application Ser. No. 570,666, filed Aug. 5, 1966. The aforenoted applications were filed by Robert L. James and assigned to The Bendix Corporation, assignee of the present invention.

BACKGROUND OF THE INVENTION

Field of the invention

The digital system disclosed and claimed in the aforenoted U.S. application Ser. No. 558,327, provides an analog output having an amplitude corresponding to the integral of an input signal amplitude. The pulse generator including the voltage to frequency converter disclosed and claimed in the aforenoted U.S. application Ser. No. 570,-666 provides pulses at a frequency corresponding to the amplitude of the input signal and a counter constructed according to the present invention counts the total number of pulses and provides a digital output corresponding thereto, which digital output is converted into the analog output. The control circuit disclosed and claimed in the aforenoted U.S. application Ser. No. 570,643 provides pulses for commanding the counter to count up or count down and for inhibiting the counter from operating when the counting direction is changing.

DESCRIPTION OF THE PRIOR ART

Heretofore binary counters for digital systems required complex circuitry and had poor reliability and relatively slow response. The counters required control circuitry of the electromechanical type which consumed excessive weight and space, thereby further decreasing the suitability of the counters for flight and space applications.

SUMMARY OF THE INVENTION

The novel binary counter of the present invention is particularly adaptable to microcircuit construction having reduced weight and size and increased reliability. Each stage of the counter comprises a flip-flop having two stable states. Each stable state provides a digital output at a predetermined logic level, which output corresponds to a binary bit of the total number of pulses provided by the pulse generator, and simultaneously provides another output at a complementary logic level. The first flip-flop is driven by the pulse generator and each succeeding flip-flop is driven by an exclusive OR gate in response to the outputs from the preceding stage. Each stage of the counter, thus driven, causes the counter to count up or count down. When the counting direction changes, the second stage of the counter is inhibited from operating, which in turn, inhibits the succeeding stages from operating.

One object of this invention is to provide a novel binary counter having reduced weight and size and increased reliability so as to be particularly useful in flight and space applications.

Another object of this invention is to provide a binary counter having a plurality of stages each of which provides outputs corresponding to a binary bit of a digital number, which outputs from each preceding stage of the counter drive the next succeeding stage thereof.

Another object of this invention is to provide means associated with each succeeding stage of the counter for applying the outputs from the preceding stage to said succeeding stage.

Another object of this invention is to render the counter responsive to count up or count down command pulses.

Another object of this invention is to inhibit the counter from operating when the counting direction is changing.

These and other objects and features of the invention are pointed out in the following description in terms of the embodiment thereof which is shown in the accompanying drawing. It is to be understood, however, that the drawing is for the purpose of illustration only and is not a definition of the limits of the invention, reference being had to the appended claims for this purpose.

DESCRIPTION OF THE DRAWING

The single figure of the drawing is an electrical schematic diagram showing a system including three stages of a counter constructed according to the invention.

DESCRIPTION OF THE INVENTION

With reference to the drawing, an input signal source 2 provides across a grounded output conductor 3 and output conductor 4 a suppressed carrier modulated alternating current signal such as is used in flight control systems or other servo systems. The signal from the input signal source 2 is applied through the conductor 4 to an input of a pulse generator 6 having a grounded input output conductor 7. The pulse generator 6 modulates the input signal and includes a voltage to frequency converter of a type disclosed and claimed in the aforenoted U.S. application Ser. No. 570,666 for providing at an output conductor 8 pulses at a frequency corresponding to the amplitude of the signal from the input signal source 2.

The pulses provided by the pulse generator 6 are applied through the output conductor 8 to a binary counter constructed in accordance with the invention and designated by the numeral 10. As heretofore noted, the binary counter 10 includes a plurality of stages each of which comprises a flip flop, with the first two of said flip flops being shown and designated by the numerals 12 and 50.

The output conductor 8 of the pulse generator 6 is connected then to an input terminal of the flip flop 12 having a grounded input output terminal 13. The flip flop 12 responds to the pulses applied through the output conductor 8 so as to provide at an output conductor 14 a digital output at a predetermined logic level and corresponding to a binary bit of the total number of the pulses provided by the pulse generator 6. A conductor 18 joining the conductor 14 at a point 20 leads to an input of an AND gate 22 having a grounded input output conductor 23. The AND gate 22 is included in an exclusive OR gate 24, which exclusive OR gate 24 follows the first stage flip flop 12 and precedes the second stage of the counter 10 represented by the flip flop 50. The exclusive OR gate 24 includes the AND gate 22 and another AND gate 26 and a NOR gate 28, which NOR gate 28 is driven by the AND gates 22 and 26 as will be hereinafter described.

Flip flop 12 provides at a second output conductor 28 and output at a predetermined logic level complementary to the predetermined logic level of the digital output provided at the other output conductor 14 of the flip flop 12. For example, when the digital output at the output conductor 14 is at a logic "one" level, the complementary output at the output conductor 28 is at a logic "zero" level. When the digital output at conductor 14 is at a logic "zero" level, the complementary output at conductor 28 is at a logic "one" level. The output at the output conductor 28 of the flip flop 12 is applied through the output conductor 28 to an input of the AND gate 26 of the exclusive OR gate 24, said AND gate 26 having a grounded input output conductor 29.

A command circuit 30 which may be of a type described in the aforenoted copending U.S. application Ser. No. 570,643 is driven by the output from the voltage to frequency converter included in the pulse generator 6, which output is applied to an input of the command circuit 30 through a second output conductor 31. The command circuit 30 has a grounded input output conductor 33 and provides an output pulse across the grounded output conductor 33 and conductor 32 which pulse at the conductor 32 when at a predetermined negative level commands the counter 10 to count up, and while when at a predetermined positive level at the conductor 32 commands the counter to count down.

The command pulse is applied through the output conductor 32 to an amplifier 34 having a ground input output conductor 35. The amplifier 34 provides at an output conductor 42 thereof a pulse having a polarity opposite to that of the pulse provided by the command circuit 30 at the output conductor 32, and provides at an output conductor 38 a pulse of the same polarity as the pulse provided by the command circuit 30 at the output conductor 32. The pulse at the output conductor 38 is applied therethrough to a second input of the AND gate 26 in the exclusive OR gate 24, while the pulse in the output conductor 42 is applied therethrough to a second input of the AND gate 22 in the exclusive OR gate 24. The AND gates 22 and 26, are responsive to the pulses applied through conductors 42 and 38 from the amplifier 34 and through conductors 18 and 28 from the flip flop 12 so that there is provided at either an output conductor 44 and the AND gate 22 or at an output conductor 46 of the AND gate 26 a pulse for driving the NOR gate 28 in the exclusive OR gate 24.

The NOR gate 28 has a grounded input output conductor 47 and the conductors 44 and 46 connected at separate input terminals thereof so that the NOR gate 28 is driven by either the pulse from the AND gate 26 or the pulse from the AND gate 22 to provide at an output conductor 48 a pulse opposite in polarity to the driving pulse, which pulse of opposite polarity is applied through the output conductor 48 to an input of the second stage flip flop 50 of the binary counter 10. The flip flop 50 has a grounded input output conductor 51. The flip flop 50, in response to the output pulse applied at conductor 48 leading from the NOR gate 28, provides at an output conductor 52 thereof a digital output at a predetermined logic level, which digital output corresponds to another binary bit of the total number of the pulses provided by the pulse generator 6, and provides at a second output conductor 54 an output at a predetermined logic level complementary to the level of the digital output at the other output conductor 52.

The digital output from the flip flop 50 is applied to an exclusive R gate 24A through a conductor 53 joining the conductor 52 at a point 55 while the complementary output is applied through the conductor 54 to another input of the exclusive OR gate shown generally in the figure and designated by the numeral 24A and which may be of a corresponding structure to that of the exclusive OR gate 24. One of the outputs from the amplifier 34 is in turn applied through a conductor 39 joining the output conductor 38 at a point 41 and through a conductor 43 joining the output conductor 42 at a point 45 to the exclusive OR gate 24A. The conductors 43 and 53 lead to an AND gate such as the AND gate 22 in the exclusive OR gate 24, and the conductors 39 and 54 lead to an AND gate such as the AND gate 26 in the exclusive OR gate 24. The exclusive OR gate 24A has a grounded input output conductor 47A and an output conductor 48A leading from a NOR gate such as the NOR gate 28 in the exclusive OR gate 24, at which output conductor 48A there is provided a pulse for driving the third stage of the counter 10 designated by the numeral 50A as heretofore noted with reference to the exclusive OR gate 24 and the second stage of the counter 10 represented by the flip flop 50.

The third stage 50A of the counter 10 has a grounded input output conductor 51A and provides a digital output at an output conductor 52A and a complementary output at an output conductor 54A. The outputs from the third stage 50A of the counter 10 are applied through the conductor 53A joining the conductor 52A at a point 55A and through the conductor 54A to the next stage of the counter 10, which next stage is preceded by an exclusive OR gate such as the exclusive OR gates 24 and 24A.

The digital outputs from the first and second stages of the counter 10 represented by flip flops 12 and 50, and from the third stage thereof designated by the numeral 50A, at the output conductors 14, 52 and 52A, respectively, are applied to inputs of a digital to analog converter 16 through the output conductors 14, 52 and 52A, which digital to analog converter 16 has the grounded input output conductor 17 and provides at the output conductor 19 an analog output corresponding to the digital outputs applied thereto.

An inhibit circuit 56 such as that described in the aforenoted copending U.S. application Ser. No. 570,643 has a grounded input output conductor 57 and is driven by the output of the voltage to frequency converter included in the pulse generator 6, which output is applied to the inhibit circuit 56 through the output conductor 31 and a conductor 11 leading from the conductor 31 at a point 13 to an input of the inhibit circuit 56. The inhibit circuit 56 provides an inhibit pulse at an output conductor 58 thereof, which inhibit pulse is applied through the output conductor 58 to an input of an amplifier 60 having a grounded input output conductor 61 and therefrom through an output conductor 62 of the amplifier 60 to the second stage of the binary counter 10 represented by the flip flop 50. When the inhibit pulse provided by the inhibit circuit 56 is at a predetermined level as described in the aforenoted copending U.S. application Ser. No. 570,643, the flip flop 50 will be inhibited thereby from operating and thus prevents the succeeding stages of the counter 10 from operating since each succeeding flip flop is driven by the preceding flip flop as heretofore noted.

OPERATION

In order to describe the operation of the novel binary counter of the present invention it will be assumed that initially, the flip flops 12 and 50 are each in the same stable state so that there is provided at the output conductors 14 and 52, respectively, digital outputs at a positive or logic "one" level. It will also be assumed that there is provided by the command circuit 30 at the output conductor 32 thereof a command pulse at a negative level for commanding counter 10 to count up as described in the aforenoted U.S. application Ser. No. 570,643.

The pulse generator 6 provides at the output conductor 8 thereof a positive going pulse which positive going pulse is applied to the flip flop 12 causing the flip flop 12 to change states so that the digital output at the output conductor 14 of the flip flop 12 changes from a positive or logic "one" level to ground or logic "zero" level. The output at the output conductor 28 of the flip flop 12 is then at a complementary positive or logic "one" level as heretofore noted.

The polarity of the pulses at the output conductors 14 and 52 of the flip flops 12 and 50, respectively, as well as the polarity of the pulses provided by the pulse generator 6 and the command circuit 32 are indicated in the figure.

The output at the output conductor 14 of the flip flop 12, at ground level, is applied to the AND gate 22 in the exclusive OR gate 24, and the output at the output conductor 28 of the flip flop 12, at the positive level is applied to the AND gate 26 in the exclusive OR gate 24. The negative count up command pulse from the command circuit 32 is applied to the amplifier 34, which amplifier 34 provides at the output conductor 42 an inverted or positive pulse and provides at the output conductor 38 a negative pulse. The positive pulse is applied through the conductor 42 to the AND gate 22, which AND gate 22 is rendered effective by said pulse for passing the pulse at ground level from the flip flop 12, with this latter pulse being provided at the output conductor 44 of the AND gate 22. The pulse at ground level is applied through the output conductor 44 to the NOR gate 28, which NOR gate 28 provides at the output conductor 48 an inverted pulse at a positive level. It is to be noted in this connection, that during this time the AND gate 26 is inhibited from passing the complementary pulse at a positive level from the flip flop 12 by the pulse at the negative level at the output conductor 38 from the amplifier 34, and thus the AND gate 26 does not affect the NOR gate 28.

The positive pulse at the output conductor 48 of the NOR gate 28 is applied through the output conductor 48 to the flip flop 50 causing the flip flop 50 to change states. Since flip flop 50 initially provided at the output conductor 52 thereof a digital output at a positive or logic "one" level, the change in state of the flip flop 50 causes to be provided at the output conductor 52 a digital output at ground or a logic "zero" level as indicated in the figure. The flip flop 12 and the flip flop 50 each have changed states, initially providing pulses at a logic "one" level and now providing pulses at a logic "zero" level, thus constituting a count up operation.

When the command circuit 30 provides a count down pulse at a positive level, amplier 34 will provide at the output conductor 42 a pulse at a negative level, which negative pulse is applied to the AND gate 22, and will provide at an output conductor 38 a pulse at a positive level which pulse is applied to the AND gate 26. The AND gate 26 is responsive to said positive pulse for passing the pulse at a positive level applied to the AND gate 26 through the output conductor 28 of the flip flop 12, which pulse is inverted by the NOR gate 28 for providing a negative pulse for driving the flip flop 50. During this time the AND gate 22 is inhibited from affecting the NOR gate 28 by the negative pulse from the amplifier 34.

The digital and complementary outputs from the flip flop 50 are applied to the exclusive OR gate 24A which exclusive OR gate 24A drives the third stage 50A of the counter 10, as heretofore noted with reference to the exclusive OR gate 24 and the second stage 50 of the counter 10. The digital to analog converter 16 is responsive to the digital outputs applied thereto through the conductors 14, 52 and 52A from the respective stages of the binary counter 10 and provides an analog output corresponding thereto at the output conductor 19.

When the inhibit circuit 56 provides the inhibit pulse, which inhibit pulse is applied to the second stage of the binary counter 10 represented by the flip flop 50, the flip flop 50 is inhibited from responding to any input pulses such as may be applied thereto from the NOR gate 28. The flip flop 50 thus remains in its prior state with no change occurring in the logic level of the pulses at the output conductors 52 and 54 thereof. Each of the succeeding flip flops also remain in the same state since each succeeding flip flop is driven by the preceding flip flop, with the counter 10 being thus inhibited from operating.

The novel arrangement of the present invention is particularly adapted to microcircuit construction and thus is useful in flight control systems or other systems where reduced space and weight and increased reliability are prime considerations. Moreover, a novel binary counter constructed in accordance with the present invention operates instantaneously and presents few maintenance and replacement problems. The novel feature, whereby the counter is inhibited from operating when the counting direction is changing, insures that accurate digital outputs will be provided.

Although only one embodiment of the invention has been illustrated and described, various changes in the form and relative arrangements of the parts, which will now appear to those skilled in the art may be made without departing from the scope of the invention. Reference is therefore, to be had to the appended claims for a definition of the limits of the invention.

What is claimed is:

1. A counter for use in a system including a pulse generator for providing pulses at a frequency corresponding to the amplitude of an input signal, the counter for counting the total number of pulses and for providing outputs corresponding thereto, means for providing a counting direction command pulse, means for providing a pulse for inhibiting the counter from operating when the counting direction is changing, and a converter for converting the outputs provided by the counter to an analog output, said counter comprising:

at least three stages;

the first of said stages being connected to the pulse generator for providing outputs corresponding to a binary bit of the total number of pulses provided by the pulse generator;

means for operably connecting the second of said stages to the first stage and to the counting direction command pulse means, and the second stage being reresponsive through said connecting means to the output from the first stage and to the counting direction command pulse for providing outputs corresponding to a binary bit of the total number of pulses provided by the pulse generator; and means for operably connecting the third of said stages to the second stage and to the counting direction command pulse means, and the third stage being responsive through said connecting means to the outputs from the second stage and to counting direction command pulse for providing outputs corresponding to a binary bit of the total number of pulses provided by the pulse generator.

2. A binary counter as described by claim 1, wherein:

each stage of the counter provides a digital output at a predetermined logic level, and simultaneously provides another output at a complementary logic level, which outputs correspond to a binary bit of the total number of pulses provided by the pulse generator.

3. A binary counter as described by claim 2, wherein:

the means for operably connecting the second stage to the first stage and to the counting direction command pulse means includes a first gate;

the means for operably connecting the third stage to the second stage and to the counting direction command pulse means includes a second gate;

the first gate is responsive to the digital output and the complementary output from the first stage and to the counting direction command pulse for providing a driving pulse for driving the second stage; and the second gate is responsive to the digital output and the complementary output from the second stage and to the counting direction command pulse for providing the driving pulse for driving the third stage.

4. A binary counter as described by claim 3, wherein the first and second gates each include:

first means responsive to the digital output from the preceding stage and to the counting direction command pulse for providing a pulse corresponding to the digital output when the command pulse is in a predetermined sense so as to command one counting direction;

second means responsive to the complementary output from the preceding stage and to the counting direction command pulse for providing a pulse corresponding to the complementary output when the command pulse is in another predetermined sense so as to command another counting direction; and third means connected to the first and second means and responsive to one of the pulses therefrom for providing the driving pulse.

5. A binary counter as described by claim 4, wherein:

the driving pulse provided by the third means is in a sense opposite to the pulse provided by the first means when the third means is responsive to said pulse; and the driving pulse provided by the third means is in a sense opposite to the pulse provided by the second means when the third means is responsive to said pulse.

6. A binary counter as described by claim 4, wherein:

the first means is unresponsive to the digital output from the preceding stage when the command pulse is in the other predetermined sense; and the second means is unresponsive to the complementary output from the preceding stage when the command pulse is in the one predetermined sense.

7. A binary counter as described by claim 3, wherein:

the second stage of the counter is connected to the inhibit pulse means and is inhibited from responding to the driving pulse by the inhibit pulse; and the third stage of the counter is inhibited from responding to the corresponding driving pulse when the second stage is so inhibited.

8. A binary counter as described by claim 2, wherein each of the stages is connected to a converter, and the converter is responsive to the digital outputs therefrom for providing an analog output corresponding to the total number of pulses provided by the pulse generator.

9. A binary counter as described by claim 1, wherein:

each stage of the counter includes means having two stable states;

the first stage of the counter is driven from one of its stable states to the other in response to the pulses from the pulse generator; and each stage of the counter succeeding the first stage is driven from one of its stable states to the other in response to the outputs from the preceding stage and in response to the counting direction command pulse.

10. A counter for use in a system including a pulse generator for providing pulses at a frequency corresponding to the amplitude of an input signal, the counter for counting the total number of pulses and for providing outputs corresponding thereto, means for providing a counting direction command pulse, means for providing a pulse for inhibiting the counter from operating when the counting direction is changing, and a converter for converting the outputs provided by the counter to an analog output, said counter comprising:

a plurality of stages;

a first stage of the plurality of stages being connected to the pulse generator for providing outputs corresponding to a binary bit of the total number of pulses provided by the pulse generator;

a second stage of the plurality of stages;

means associated with the second stage for operably connecting the second stage to the first stage and to the counting direction command pulse means, and the second stage being responsive through said connecting means to the outputs from the first stage and to the counting direction command pulse for providing outputs corresponding to a binary bit of the total number of pulses provided by the pulse generator; and means associated with each succeeding stage of the counter for operably connecting said succeeding stage to a preceding stage and to the counting direction command pulse means, and each succeeding stage being responsive through the connecting means associated therewith to the output of the preceding stage and to the counting direction command pulse for providing outputs corresponding to binary bits of the total number of pulses provided by the pulse generator.

11. A counter for use in a system including a pulse generator for providing pulses at a frequency corresponding to the amplitude of an input signal, the counter for counting the total number of pulses and for providing outputs corresponding thereto, means for providing a counting direction command pulse, means for providing a pulse for inhibiting the counter from operating when the counting direction is changing, and a converter for converting the outputs provided by the counter to an analog output, said counter comprising:

a plurality of successive stages;

the first stage of said plurality being connected to the pulse generator for providing outputs corresponding to a binary bit of the total number of pulses provided by the pulse generator;

means associated with each succeeding stage of the counter for operably connecting said succeeding stage to a preceding stage and to the counting direction command pulse means; and each succeeding stage being responsive through the connecting means associated therewith to the output of the preceding stage and to the counting direction command pulse for providing outputs corresponding to binary bits of the total number of pulses provided by the pulse generator.

12. A binary counter as described by claim 9, wherein said means associated with each succeeding stage of the counter includes a gate responsive to the digital output and the complementary output from the preceding stage and to the counting direction command pulse for providing a driving pulse for driving the succeeding stage.

References Cited

UNITED STATES PATENTS

| | | | |
|---|---|---|---|
| 3,391,342 | 7/1968 | Gordon | 328—44 |
| 3,423,576 | 1/1969 | Abe | 235—92 |

MAYNARD R. WILBUR, Primary Examiner

ROBERT F. GNUSE, Assistant Examiner

U.S. Cl. X.R.

340—347